United States Patent
Teeka Srinivasa Shetty et al.

(10) Patent No.: US 7,538,701 B2
(45) Date of Patent: May 26, 2009

(54) SYSTEM AND METHOD FOR IMPROVING DYNAMIC PERFORMANCE OF A CIRCUIT

(75) Inventors: Venkatesh Teeka Srinivasa Shetty, Bangalore (IN); Chandrashekar Lakshminarayanan, Thanjavur (IN); Prasun Kali Bhattacharya, Burdwan (IN); Prasenjit Bhowmik, Agartala (IN); Srinivasan Chakravarthy, Bangalore (IN); Mukesh Khatri, Indore (IN); Sanjeeb Kumar Ghosh, Chandan-Pukur (IN); Sumanth Chakkirala, Vasco-da-gama (IN); Sundararajan Krishnan, Bangalore (IN); Prakash Easwaran, Bangalore (IN)

(73) Assignee: Cosmic Circuits Private Limited, Bangalore (IN)

( * ) Notice: Subject to any disclaimer, the term of this patent is extended or adjusted under 35 U.S.C. 154(b) by 0 days.

(21) Appl. No.: 11/760,746

(22) Filed: Jun. 9, 2007

(65) Prior Publication Data

US 2007/0285297 A1   Dec. 13, 2007

(51) Int. Cl.
H03M 1/20   (2006.01)

(52) U.S. Cl. .................. 341/131; 341/118; 341/120; 341/143; 341/155

(58) Field of Classification Search .................. 341/131, 341/143, 118, 120, 126, 155
See application file for complete search history.

(56) References Cited

U.S. PATENT DOCUMENTS

| | | | |
|---|---|---|---|
| 5,220,326 A | | 6/1993 | Ledzius et al. |
| 5,387,914 A | | 2/1995 | Mangelsdorf |
| 5,493,298 A | * | 2/1996 | Bartz .......................... 341/131 |
| 5,627,535 A | * | 5/1997 | Ichimura et al. ............ 341/131 |
| 5,745,061 A | * | 4/1998 | Norsworthy et al. ........ 341/131 |
| 6,064,328 A | * | 5/2000 | Scheidig et al. ............. 341/155 |
| 6,175,321 B1 | * | 1/2001 | Frannhagen et al. ........ 341/143 |
| 6,462,685 B1 | * | 10/2002 | Korkala ...................... 341/131 |
| 6,535,157 B1 | | 3/2003 | Garrity et al. |
| 6,639,532 B1 | * | 10/2003 | Liu et al. ..................... 341/143 |
| 6,661,214 B1 | | 12/2003 | Hann et al. |
| 6,822,601 B1 | * | 11/2004 | Liu et al. ..................... 341/161 |
| 6,825,790 B2 | | 11/2004 | Chou |
| 6,891,493 B2 | | 5/2005 | Whittaker et al. |
| 6,963,300 B1 | | 11/2005 | Lee |
| 6,970,120 B1 | * | 11/2005 | Bjornsen ..................... 341/120 |
| 7,015,851 B1 | * | 3/2006 | Bruhns et al. ............... 341/155 |
| 7,015,853 B1 | * | 3/2006 | Wolff et al. ................. 341/155 |
| 7,107,175 B2 | * | 9/2006 | Maloberti et al. ........... 702/126 |
| 7,158,443 B2 | | 1/2007 | Lin |
| 7,248,199 B2 | | 7/2007 | Asano et al. |
| 7,253,686 B2 | | 8/2007 | Ali |
| 7,285,996 B2 | | 10/2007 | Fiedler |
| 7,286,075 B2 | * | 10/2007 | Hennessy et al. ........... 341/172 |
| 2005/0007267 A1 | * | 1/2005 | Zogakis et al. .............. 341/143 |
| 2005/0212575 A1 | | 9/2005 | Kim |

(Continued)

FOREIGN PATENT DOCUMENTS

WO   WO 99/63414   12/1999

*Primary Examiner*—Linh V Nguyen
(74) *Attorney, Agent, or Firm*—Kanika Radhakrishnan; Evergreen Valley Law Group P.C.

(57) ABSTRACT

A system and method for improving the dynamic performance in an analog-to-digital converter (ADC) by randomizing the differential mismatch. The differential mismatch in an input analog signal is randomized by flipping the input signal and output signal randomly.

7 Claims, 3 Drawing Sheets

U.S. PATENT DOCUMENTS

| | | |
|---|---|---|
| 2007/0030753 A1 | 2/2007 | Kwak |
| 2007/0046345 A1 | 3/2007 | Tai et al. |
| 2008/0054963 A1 | 3/2008 | Masenas |
| 2008/0143565 A1* | 6/2008 | Moore et al. ............... 341/131 |

* cited by examiner

SYSTEM AND METHOD FOR IMPROVING DYNAMIC PERFORMANCE OF A CIRCUIT

CROSS-REFERENCE TO RELATED APPLICATIONS

This application claims priority to Indian Provisional Patent Application No. 1005/CHE/2006, filed Jun. 8, 2006, and Indian Non-Provisional Patent Application No. E/2/115/2007, filed Jun. 8, 2007, which are incorporated herein in by reference.

BACKGROUND OF THE INVENTION

1. Technical Field

The present invention relates generally to Circuits, specifically Integrated Circuits (ICs) and, more particularly, to systems and methods for improving the dynamic performance in an Integrated circuit such as an Analog to Digital Converter.

2. Discussion of Prior Art

Analog to Digital Converters (ADC) are well-known circuitries and widely used in many electronic devices. They convert an analog input signal into a digital output signal as a number of bits. Such conversions are typically not 100% accurate and such inaccuracy gives rise to various artifacts including quantization noise and harmonic distortion. These artifacts may be problematic in that the purity of the digital output signal is often of great significance for those applications where an A/D conversion is required. As such, one objective of the invention is to remove these artifacts.

Total Harmonic Distortion (THD) is a common issue faced in many of the high speed ADCs in use today. The total harmonic distortion (THD) of a signal is defined as the ratio of the sum of the powers of all harmonic frequencies above the fundamental frequency to the power of the fundamental frequency. It has been shown that errors in an ADC, such as THD and Spurious Free Dynamic Range (SFDR) tend to occur at the same or multiples of the analog input signal frequency. In other words, these errors occur repeatedly at all of the harmonic frequencies above the fundamental frequency of the input signal. This is significant due to the fact that in many systems, random noise may be tolerable but the noise which is attributable to the harmonic frequencies of the input may not be tolerable.

Hence, there is a need for a system and method to improve the dynamic performance in an analog to digital converter by removing the harmonic noise.

SUMMARY OF THE INVENTION

The present invention provides improved performance in an Integrated Circuit, such as an Analog-to-Digital Converter by improving the dynamic performance via randomization of the differential mismatch.

According to one aspect of the invention, a method for improving the dynamic performance of an Integrated Circuit comprises the steps of: randomly multiplying an input signal of the analog-to-digital converter with a pseudo random bit sequence in an input stage to produce a modified input signal; processing the modified input signal in the analog-to-digital converter to generate a modified digital output signal; and multiplying the modified digital output signal with the pseudo random bit sequence used at the input stage to produce a final digital output signal, whereby even harmonics in the final digital output signal are randomized.

According to yet another aspect of the invention, an Integrated Circuit provides improved dynamic performance by randomizing the differential mismatch, according to the disclosed embodiments. The Integrated Circuit includes, a pseudo random bit sequence generator for generating a pseudo random bit sequence, a plurality of sampling switches coupled to an analog signal input for modifying the analog input signal in accordance with the pseudo random bit sequence in an input stage, and means for multiplying a digital output signal from the ADC with the same pseudo random bit sequence used in the input stage whereby even harmonics in the final digital output signal are randomized.

BRIEF DESCRIPTION OF THE DRAWINGS

These and other objects, features and advantages of the invention will be apparent from a consideration of the following Detailed Description Of The Invention considered in conjunction with the drawing Figures, in which.

DETAILED DESCRIPTION

The present invention is directed to a system, apparatus and method for improving the dynamic performance of an integrated circuit, such as an analog-to-digital integrated circuit, by randomizing the differential mismatch.

Figure 1:
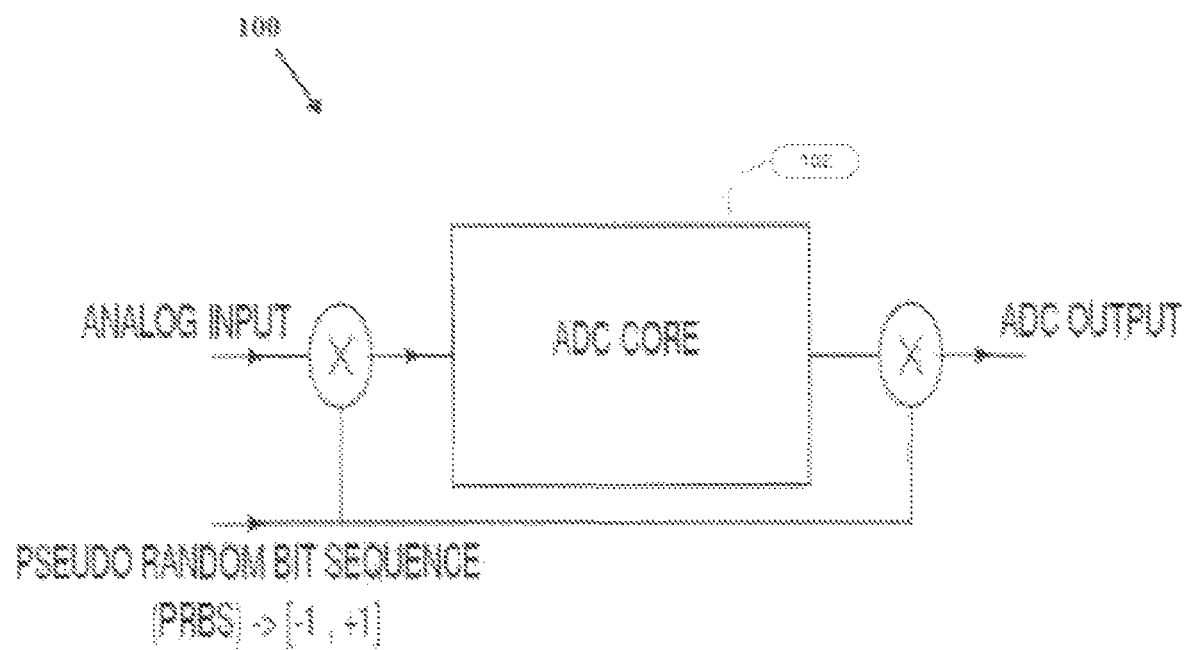
FIG. 1 is a block diagram of an analog-to-digital converter circuit, according to an embodiment of the invention.

FIG. 1 is a block diagram illustrating a system 100 for improving the dynamic performance in an analog-to-digital converter (ADC), according to one embodiment. The system 100 includes an analog to digital converter (ADC) 102, a pseudo random bit sequence generator 104 for generating a pseudo random bit sequence.

In operation, prior to applying an analog input signal to an input stage of the ADC 102, the analog input signal is first multiplied by a random bit sequence that is output from the pseudo random bit sequence generator. In the presently described embodiment, the random bit sequence is a series of +1 and −1 values. In some embodiments, the bit sequence may use other values, the general rule being multiplication by +x and −1/x values.

The output of the multiplication of the analog input signal with the random bit sequence is applied to the input of the ADC 102 as a modified analog input signal. The ADC 102 converts the modified analog input signal into a corresponding digital output signal. The digital output signal is then multiplied by the same random bit sequence used at the input stage.

By way of example, the output of the ADC is given as follows for a generalized analog input signal, f (x), Multiplication by '1'>ADCOUT=f (x), Multiplication by '−1' and flipping the value at the output>ADCOUT=−f (−x).

It is instructive to note that as a result of the multiplication, all even harmonics (i.e., $2^{nd}$, $4^{th}$, $6^{th}$ order harmonics and so on) in the ADC are randomized, and all odd harmonics (i.e., $3^{rd}$, $5^{th}$, $7^{th}$ and so on) remains the same. Also, memory in the system gets randomized and becomes noise.

One drawback with the present method is that any offset in the ADC appears as noise. An offset correction circuit is provided to solve this problem. The offset can be calibrated at a configuration stage, prior to actual use. In one embodiment, the ADC uses two internal bits to help in correcting the offset to a much higher accuracy than the number of bits in the ADC.

Figure 2:
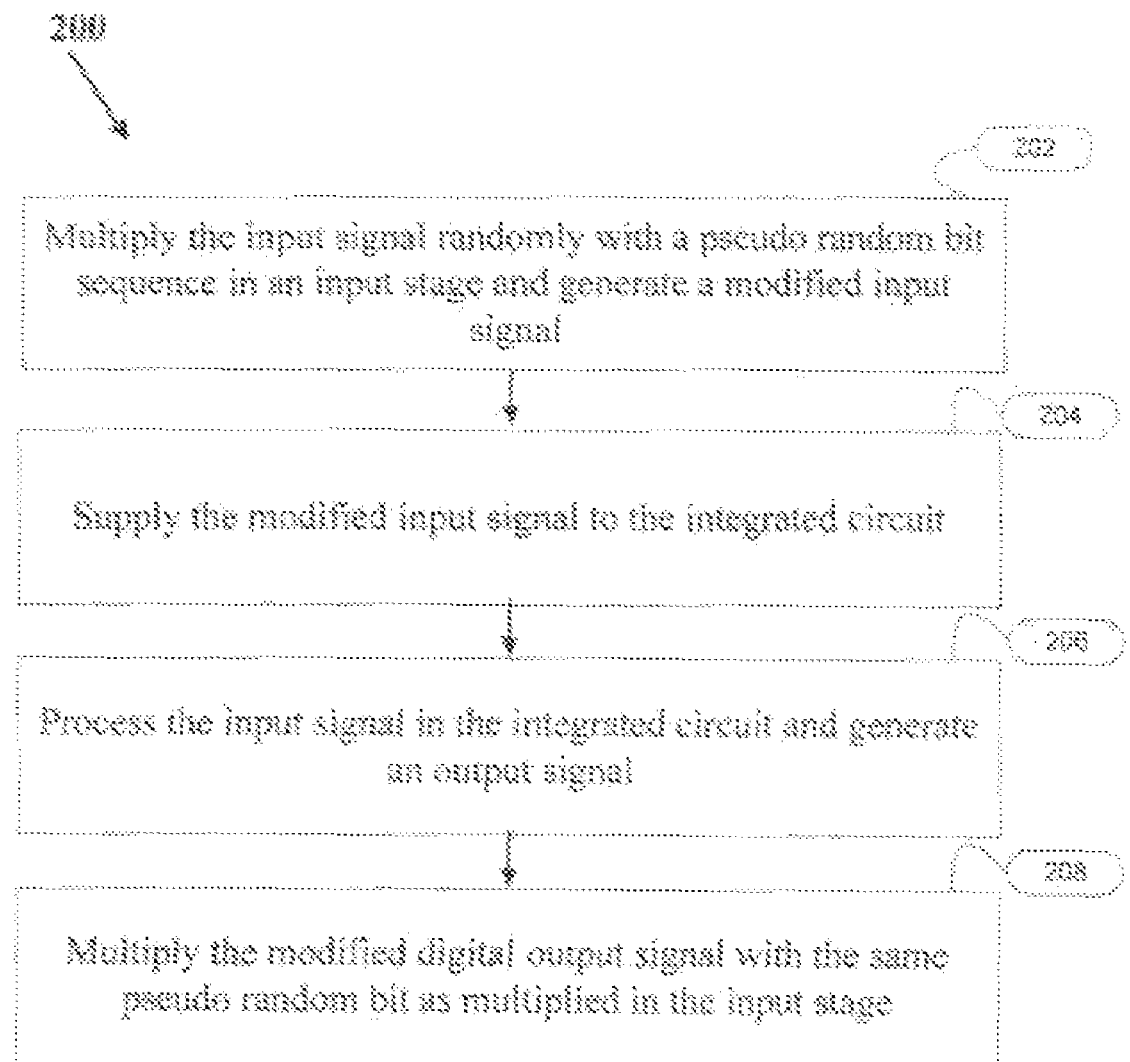
FIG. 2 is a flow diagram of a process for improving the dynamic performance in the analog-to-digital circuit of FIG. 1, according to an embodiment of the invention.

With reference now to FIG. 2, there is shown a process 200 for improving the dynamic performance in a Circuit, such as the ADC 102 shown in FIG. 1, according to one embodiment.

At step 202, the input signal supplied to the ADC 102 by multiplying the input signal randomly with a pseudo random bit sequence in an input stage. The input signal is multiplied by +1 or −1. The choice of multiplication with the pseudo random bit is random.

At step 204, after multiplication, the modified analog input signal is supplied to the ADC 102.

At step 206, the modified analog input signal is processed in the ADC 102 to generate a modified digital output signal.

At step 208, the modified digital output signal is multiplied with the same pseudo random bit as multiplied in the input stage. This multiplication scheme ensures the even harmonics ($2^{nd}$ order harmonics, $4^{th}$ order harmonics, $6^{th}$ order harmonics etc.) are randomized and the odd harmonics ($1^{st}$ order harmonics, $3^{rd}$ order harmonics, $5^{th}$ order harmonics etc.) remain the same.

Figure 3:
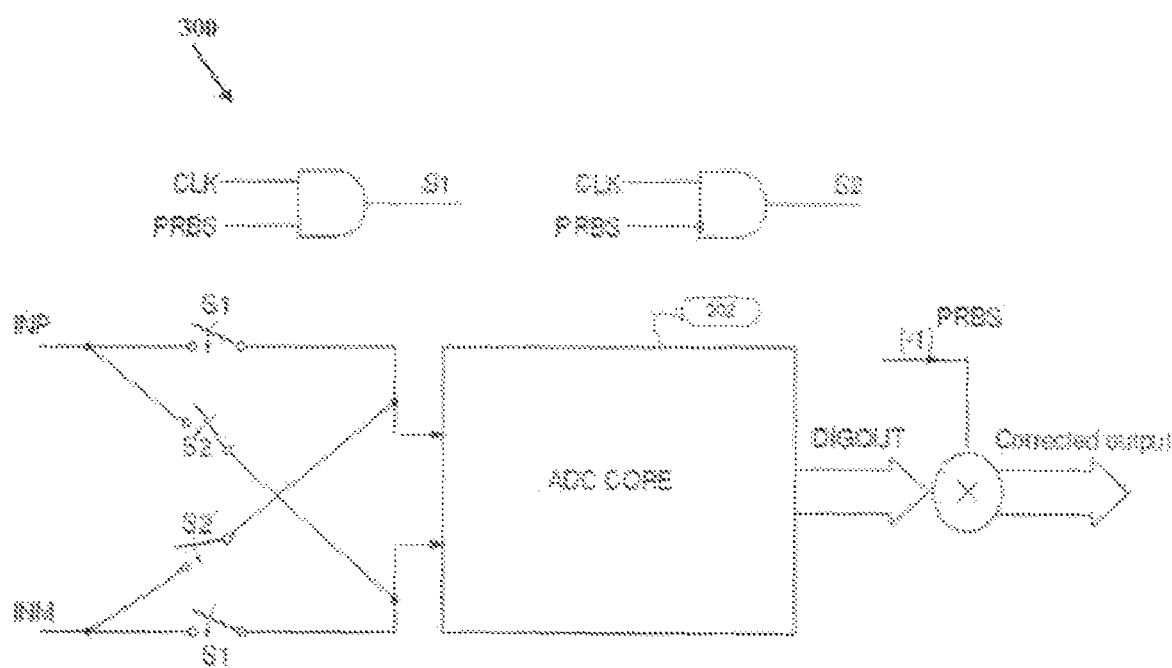
FIG. 3 is a circuit diagram illustrating an example of implementation of the system for improving dynamic performance in an ADC according to an embodiment of the invention.

FIG. 3 is a circuit diagram illustrating an exemplary ADC according to an embodiment of the invention. A differential analog input (INP, INM) is supplied to two sampling switches, labeled S1 and S2. The differential analog inputs INP and INM are coupled to the ADC core 202 through these sampling switches S1 and S2. Depending on the pseudo random bit sequence (PRBS) (+1 or −1), either S1 or S2 switch is used. The multiplication with +1 or −1 is easier to implement in a differential analog circuit.

The ADC converts the modified input signal into a corresponding modified digital output signal. In accordance with a key aspect of the invention, the modified digital output signal is multiplied again with the same pseudo-random bit sequence applied at the input stage, namely, either +1 or −1. This multiplication is easier to perform at the output stage, as it is in a digital form.

It should be appreciated that the particular exemplary embodiment of FIG. 3 is provided by way of illustration, and not limitation. Those knowledgeable in the art will recognize that various implementation circuits can be used for multiplying and re-multiplying the respective input and output signals.

It should be appreciated, that while embodiments of the present application describe the inventive principals using an analog-to-digital converter circuit, the invention is more broadly applicable to improving the dynamic performance of other integrated circuits, such as, for example, a switched capacitor circuit.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. It should particularly be noted that these teachings are applicable to any IC where differential mismatch needs to be randomized.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A method for improving the dynamic performance of a circuit, the method comprising the steps of:
    randomly multiplying an input signal of the circuit with a pseudo random bit sequence in an input stage to produce a modified input signal;
    processing the modified input signal in the circuit to generate a modified output signal; and
    multiplying the modified output signal with the pseudo random bit sequence used at the input stage to produce a final output signal, whereby even harmonics in the final output signal are randomized.

2. The method according to claim 1, wherein the pseudo random bit sequence comprises a random sequence of positive and negative values.

3. The method according to claim 2, wherein the positive values are +1 and the negative values are −1.

4. The method according to claim 1, wherein the circuit is an analog-to-digital convener (ADC) circuit.

5. The method according to claim 1, wherein the circuit is a switched capacitor circuit.

6. The method of claim 1 further comprising: removing noise due to offset in the circuit.

7. A system for improving the dynamic performance of a circuit, the system comprising:
    a pseudo-random bit sequence generator for generating a pseudo random bit sequence;
    a first multiplier for multiplying an input analog signal with said pseudo random bit sequence to provide a modified analog input signal;
    a circuit core for receiving said modified analog input signal as input and for converting said modified analog input signal to a modified digital output signal; and
    a second multiplier for multiplying said modified digital output signal with said pseudo random bit sequence to generate a final output signal.

* * * * *